(12) United States Patent
Tamura et al.

(10) Patent No.: US 8,765,272 B2
(45) Date of Patent: Jul. 1, 2014

(54) CERMET AND COATED CERMET

(75) Inventors: Keitaro Tamura, Iwaki (JP); Daisuke Takesawa, Iwaki (JP); Hiroki Hara, Iwaki (JP); Kozo Kitamura, Iwaki (JP); Yasuro Taniguchi, Iwaki (JP); Koji Hayashi, Kuki (JP); Akihiro Matsumoto, Nagoya (JP); Sung-Pyo Cho, Nagoya (JP)

(73) Assignee: Tungaloy Corporation, Fukushima (JP)

( * ) Notice: Subject to any disclaimer, the term of this patent is extended or adjusted under 35 U.S.C. 154(b) by 377 days.

(21) Appl. No.: 13/255,597

(22) PCT Filed: Mar. 10, 2010

(86) PCT No.: PCT/JP2010/053941
§ 371 (c)(1),
(2), (4) Date: Sep. 9, 2011

(87) PCT Pub. No.: WO2010/104094
PCT Pub. Date: Sep. 16, 2010

(65) Prior Publication Data
US 2012/0003466 A1    Jan. 5, 2012

(30) Foreign Application Priority Data
Mar. 10, 2009    (JP) .................. 2009-056653

(51) Int. Cl.
*B23B 9/00*    (2006.01)
(52) U.S. Cl.
USPC .............. 428/698; 75/243; 428/408; 428/701
(58) Field of Classification Search
USPC ............................. 75/243; 428/408, 698, 701
See application file for complete search history.

(56) References Cited

U.S. PATENT DOCUMENTS

| | | | |
|---|---|---|---|
| 3,971,656 | A | 7/1976 | Rudy |
| 4,778,521 | A | 10/1988 | Iyori et al. |
| 5,308,376 | A | 5/1994 | Oskarsson |
| 5,853,873 | A | 12/1998 | Kukino et al. |
| 5,882,777 | A | 3/1999 | Kukino et al. |
| 5,939,651 | A | 8/1999 | Isobe et al. |
| 6,057,046 | A | 5/2000 | Tsuda et al. |
| 6,299,992 | B1 | 10/2001 | Lindskog et al. |
| 2004/0002418 | A1 | 1/2004 | Scurlock et al. |
| 2004/0237840 | A1 | 12/2004 | Yamamoto et al. |
| 2006/0222893 | A1 | 10/2006 | Derflinger |
| 2006/0269788 | A1 | 11/2006 | Ishikawa |
| 2007/0234646 | A1 | 10/2007 | Can et al. |
| 2007/0269610 | A1 | 11/2007 | Fukui et al. |
| 2008/0254282 | A1 | 10/2008 | Kukino et al. |
| 2009/0049953 | A1 | 2/2009 | Shindo et al. |
| 2011/0117368 | A1 | 5/2011 | Matsubara et al. |
| 2012/0003466 | A1 | 1/2012 | Tamura et al. |
| 2012/0114960 | A1 | 5/2012 | Takesawa et al. |

FOREIGN PATENT DOCUMENTS

| | | |
|---|---|---|
| DE | 19704242 C1 | 8/1998 |
| EP | 1714942 | 10/2006 |
| JP | 61-195950 | 8/1986 |
| JP | 61-227910 | 10/1986 |
| JP | 62-193731 | 8/1987 |
| JP | 62-265107 | 11/1987 |
| JP | 64-068443 | 3/1989 |
| JP | 02-015139 | 1/1990 |
| JP | 02-093036 | 4/1990 |
| JP | 04-231467 | 8/1992 |
| JP | 08-309605 | 11/1996 |
| JP | 09-078174 | 3/1997 |
| JP | 02-628200 | 7/1997 |
| JP | 10-110234 | 4/1998 |
| JP | 2000-44348 | 2/2000 |
| JP | 03-152105 | 4/2001 |
| JP | 2001-181825 | 7/2001 |
| JP | 2002-302732 | 10/2002 |
| JP | 2003-136305 | 5/2003 |
| JP | 2004-292842 | 10/2004 |
| JP | 2005-194573 | 7/2005 |
| JP | 2005-200668 | 7/2005 |
| JP | 2006-111947 | 4/2006 |
| JP | 2006-315898 | 11/2006 |
| JP | 2007-084382 | 4/2007 |
| JP | 2008-188689 | 8/2008 |
| JP | 2008-208027 | 9/2008 |
| JP | 2009-034781 | 2/2009 |
| JP | 2009-067637 | 4/2009 |
| JP | 2010-031308 | 2/2010 |
| WO | WO 98/34874 | 8/1998 |

OTHER PUBLICATIONS

Kikai Gijutu (2009) vol. 57, No. 4, pp. 32-37 with English translation (extract).
Suzuki, Hard Alloy and Sintered Hart Material (1986) p. 329, fig. 2.34.
Zhang S, et al "Solid Solution Extent of WC and TaC in Ti(C,N) as Revealed by Lattice Parameter Increase", Int. J. of Refractory Metals & Hard Materials, vol. 12, No. 6 (Jan. 1, 1993) pp. 329-333.
International Search Report in PCT/JP2010/053941, dated Apr. 27, 2010.
Written Opinion in PCT/JP2010/053941, dated Apr. 27, 2010.

*Primary Examiner* — Archene Turner
(74) *Attorney, Agent, or Firm* — Womble Carlyle

(57) ABSTRACT

A cermet has a hard phase which contains W and nitrogen, and includes at least one selected from a carbide, nitride and carbonitride of a metal having Ti as a main component, and a binder phase having an iron group metal as a main component. A W amount contained in the whole cermet is 5 to 40% by weight, an interfacial phase including a complex carbonitride with a larger W amount than a W amount of the hard phase being present between grains of the hard phase, and when a W amount contained in the interfacial phase based on the whole metal element is represented by Wb (atomic %), and a W amount contained in the hard phase based on the whole metal element is represented by Wh (atomic %), then, an atomic ratio of Wb to Wh (Wb/Wh) is 1.7 or more. The cermet is excellent in fracture resistance and wear resistance.

20 Claims, No Drawings

CERMET AND COATED CERMET

RELATED APPLICATIONS

This is a 371 U.S. National Phase Application of PCT/JP2010/053941, filed 10 Mar. 2010, which claims priority to JP 2009-056653, filed 10 Mar. 2009. The contents of the aforementioned applications are incorporated by reference in their entirety.

TECHNICAL FIELD

The present invention relates to a cermet and a coated cermet which are used for a cutting tool and having good fracture resistance and wear resistance.

BACKGROUND ART

Cermet has excellent wear resistance so that it is used as a cutting tool. When a work piece material is subjected to cutting processing by using a cutting tool made of a cermet, it has been known to obtain a smooth finishing surface. As a conventional technique of the cermet, there has been known a cermet in which a hardness at the surface portion of the cermet is heightened to improve wear resistance (for example, see Patent Literature 1.). Also, there has been known a cermet in which structures at the inside and the surface portion of an alloy are controlled to improve characteristics (for example, see Patent Literature 2.).

PRIOR ART REFERENCES

Patent Literatures

[Patent Literature 1] JP Patent No. 2628200
[Patent Literature 2] JP Patent No. 3152105

SUMMARY OF THE INVENTION

In recent years, it has been desired to obtain high efficiency in cutting processing. By reducing a number of times to change cutting tools, high efficiency processing is realized, so that a cutting tool having a longer lifetime has been desired. The conventional cermet has a problem in that it easily forms defects so that longer lifetime is difficult to obtain. The present invention has been made to solve these problems, and an object thereof is to provide a cermet better in fracture resistance than those of the conventional cermet.

The present inventors have researched on cermets, and obtained findings that fracture resistance and wear resistance of a cermet is improved when an interfacial phase containing a W (tungsten) amount larger than that of a hard phase is formed between grains of the hard phase which contains W, and comprises carbonitride comprising Ti as a main component, whereby the present invention has accomplished.

That is, the cermet of the present invention comprises a hard phase which contains W and nitrogen, and comprises at least one selected from a carbide, nitride and carbonitride of a metal comprising Ti as a main component, and a binder phase comprising an iron group metal(s) as a main component(s), wherein a W amount contained in the whole cermet is 5 to 40% by weight, an interfacial phase comprising a complex carbonitride with a larger W amount than the W amount of the hard phase, the interfacial phase being present between grains of the hard phase, and when the W amount contained in the interfacial phase based on the whole metal element is represented by Wb (atomic %), and the W amount contained in the hard phase based on the whole metal element is represented by Wh (atomic %), then, an atomic ratio of Wb to Wh (Wb/Wh) being 1.7 or more.

The cermet of the present invention inhibits progress of cracks occurring in the cermet and improves fracture resistance. The coated cermet of the present invention is further excellent in wear resistance.

DETAILED DESCRIPTION

The cermet of the present invention contains W and nitrogen, and is constituted by a hard phase which comprises at least one selected from a carbide, nitride and carbonitride of a metal comprising Ti as a main component, and a binder phase comprising an iron group metal(s) as a main component(s). To produce such a cermet, it can be accomplished by adding W and nitrogen to a starting powder, and sintering it in a mixed gas comprising argon and nitrogen.

The hard phase of the present invention contains W and nitrogen, and comprises at least one selected from a carbide, nitride and carbonitride of a metal comprising Ti as a main component. The metal element contained in the hard phase of the present invention comprises W and Ti as essential components, and may contain at least one selected from the elements of Groups 4 (Ti, Zr, Hf, etc.), 5 (V, Nb, Ta, etc.) and 6 (Cr, Mo, W, etc.) of the Periodic Table other than W and Ti. In the present invention, "comprising Ti as a main component" means that among elements of Groups 4, 5 and 6 of the Periodic Table contained in the hard phase, an amount of Ti is the highest in an atomic ratio, and more specifically, it means that Ti contained in the hard phase is 50 atomic % or more based on the sum of the elements of Groups 4, 5 and 6 of the Periodic Table contained in the hard phase. Incidentally, the hard phase of the present invention contains W, so that Ti becomes 50 to 95 atomic %. To control an amount of the Ti contained in the hard phase in the above-mentioned range, it can be accomplished by making the amount of Ti based on the element(s) of Group 4, 5 or 6 of the Periodic Table in the starting powder 50 atomic % or more.

When the form of the hard phase of the present invention is explained in detail, the hard phase comprises at least one of (1) a complex carbonitride solid solution containing Ti and one or more element(s) of Group 4, 5 or 6 of the Periodic Table other than Ti, (2) a core-rim structure carbonitride comprising a titanium carbonitride core portion, and a peripheral portion comprising a complex carbonitride solid solution containing Ti and one or more element(s) of Group 4, 5 or 6 of the Periodic Table other than Ti, (3) a core-rim structure carbonitride comprising a core portion which comprises a complex carbonitride solid solution containing Ti and one or more element(s) of Group 4, 5 or 6 of the Periodic Table other than Ti, and a peripheral portion comprising a complex carbonitride solid solution containing Ti and one or more element(s) of Group 4, 5 or 6 of the Periodic Table other than Ti, and may preferably contain (4) titanium carbonitride.

The interfacial phase of the present invention is a layered complex carbonitride having an average thickness of 10 to 500 nm and formed between grains of the hard phase comprising at least one of the above-mentioned (1) to (3). The interfacial phase of the present invention is carbonitride containing Ti and W and a crystal structure of which is a NaCl structure. The interfacial phase of the present invention is characterized in that its W amount is larger than that contained in the adjacent hard phase. More specifically, when the W amount contained in the interfacial phase based on the whole metal element is represented by Wb (atomic %), and the W amount contained in the hard phase based on the whole metal element is represented by Wh (atomic %), then, an atomic ratio of Wb to Wh (Wb/Wh) is 1.7 or more. If Wb/Wh is 1.7 or more, an effect of restraining progress of crack generated in the cermet can be obtained, while if Wb/Wh is less than 1.7, such an effect cannot be obtained. The ratio Wb/Wh is preferably 1.9 or more, and more preferably 2.1 or more. An upper limit value of Wb/Wh is preferably 3.0 or less, and more preferably 2.8 or less.

For forming the interfacial phase of the present invention, when W and nitrogen are contained in the starting powder of the cermet, and it is sintered in a mixed gas atmosphere of argon and nitrogen and cooled, then, in the course of cooling procedure, solubility of the solute element(s) in the binder phase decreases accompanying with the cooling, and a hard phase containing a larger W amount than that of the surface portion of the hard phase precipitates at the surface, whereby W is stably precipitated between grains of the hard phase or at the grain boundary triple points so that an interfacial phase comprising a complex carbonitride containing a W amount larger than a W amount of the hard phase can be obtained. Incidentally, the interfacial phase is considered to be formed during sintering and during cooling. As one of conditions to form the interfacial phase of the present invention, there may be mentioned an addition of W. If the W amount contained in the whole cermet is less than 5% by weight, an interfacial phase having a sufficiently crack preventing effect cannot be obtained. Also, if the W amount contained in the whole cermet is in excess of 40% by weight, wear resistance of the hard phase is lowered. Thus, the W amount contained in the whole cermet is set to 5 to 40% by weight. Of these, the W amount contained in the whole cermet is more preferably 8 to 32% by weight, and particularly preferably 10 to 26% by weight. To make the W amount contained in the cermet within the above-mentioned range, one can make the ratio of W based on the total amount of the whole component in the starting powder within the above-mentioned range.

When the hard phase of the present invention comprises (3) a core-rim structure carbonitride comprising a core portion which comprises a complex carbonitride solid solution containing Ti and one or more element(s) of Group 4, 5 or 6 of the Periodic Table other than Ti, and a peripheral portion comprising a complex carbonitride solid solution containing Ti and one or more element(s) of Group 4, 5 or 6 of the Periodic Table other than Ti, the interfacial phase of the present invention can be easily formed. The hard phase of the core-rim structure according to the present invention means that the composition of the core portion and the composition of the peripheral portion are different from each other, and has a microstructure wherein the core portion is a grain state having a diameter of about 0.05 to 10 µm, and the peripheral portion having a thickness of about 0.05 to 10 µm surrounds a part or whole of the core portion. Incidentally, the interfacial phase of the present invention is formed at the outside the hard phase of the core-rim structure. Among the hard phase of the core-rim structure, when a W amount contained in the core portion of the hard phase based on the whole metal element is represented by Wc (atomic %) and a W amount contained in the peripheral portion of the hard phase based on the whole metal element is represented by Wr (atomic %), and an atomic ratio of Wc to Wr (Wc/Wr) is 1.4 or less, then, the interfacial phase of the present invention is easily formed, and it is preferably 1.3 or less. A lower limit value of Wc/Wr is preferably 0.5 or more, more preferably 0.7 or more.

The binder phase comprising one or more iron group metal(s) as a main component(s) of the present invention means a phase wherein less than 40% by weight of one or more element(s) of Group 4, 5 or 6 of the Periodic Table is dissolved in the iron group metal(s). In the present invention, the iron group metal means Co, Ni and Fe. Among these, when the binder phase comprises one or both of Co and Ni as a main component(s), mechanical strength is improved so that it is more preferred. Of these, when the binder phase comprises Co as a main component, adhesiveness of the cermet and the hard film is improved so that it is more preferred. Incidentally, the cermet of the present invention contains W, so that W is dissolved in one or more iron group metal(s) of the binder phase, but for dissolving the hard phase component(s) into the binder phase or for improving the characteristics of the binder phase, one or more element(s) of Group 4, 5 or 6 of the Periodic Table may be dissolved in one or more iron group metal(s) of the binder phase in an amount of less than 40% by weight, preferably less than 30% by weight. The lower limit of an amount of the one or more element(s) of Groups 4, 5 and 6 of the Periodic Table to be dissolved in the binder phase is preferably 2% by weight or more, more preferably 5% by weight or more. Most preferably, the one or more element(s) of Groups 4, 5,and 6 of the Periodic Table is dissolved in an iron group metal in a total amount of 18% or more by weight and 32% or less by weight.

A coated cermet in which a hard film comprising an oxide, carbide, nitride of one or more element(s) of Groups 4, 5 and 6 of the Periodic Table, Al, Si and a mutual solid solution thereof, a hard carbon film, etc. is coated by the PVD method or CVD method on the surface of the cermet of the present invention, is excellent in wear resistance. Specific examples of the hard film may be mentioned TiN, TiC, TiCN, TiAlN, TiSiN, AlCrN, $Al_2O_3$, diamond, diamond-like carbon (DLC), etc.

The cermet of the present invention can be obtained by a process for preparing a cermet which comprises subjecting a mixture comprising at least one powder selected from a carbide, nitride and carbonitride of one or more element(s) of Groups 4, 5 and 6 of the Periodic Table which contains W and nitrogen, and contains Ti as a main component, and powder of an iron group metal(s) to the following steps of:

(A) a step of elevating a temperature thereof to a first heating temperature of 1200 to 1400° C. in non-oxidative atmosphere, (B) a step of elevating a temperature thereof from the first heating temperature of 1200 to 1400° C. to a second heating temperature of 1480 to 1580° C. in a mixed gas atmosphere of nitrogen and argon at a pressure of 1 Torr or more, (C) a step of sintering the same at the second heating temperature of 1480 to 1600° C. in a mixed gas atmosphere of nitrogen and argon at a pressure of 1 Torr or more while controlling a nitrogen partial pressure to 0.25 Torr or more for a predetermined time, and (D) a step of cooling the mixture to terminate the step (C) to return to a normal temperature.

More specifically, at least one powder selected from a carbide, nitride and carbonitride of one or more element(s) of Groups 4, 5 and 6 of the Periodic Table which contains W and nitrogen, and contains Ti as a main component, and powder of an iron group metal(s) are prepared. They are weighed to become the predetermined composition, mixed with the solvent by a wet ball mill, and after mixing, the solvent is evaporated to dry the mixture. To the obtained mixture is added a wax for molding such as paraffin, etc., to mold to a predetermined shape. As a method for molding, there may be mentioned a press molding, extrusion molding, injection molding, etc. The molded mixture is placed in a sintering furnace, and after removing wax by raising the temperature to 350 to 450° C. in vacuum, the temperature is raised to the first heating temperature of 1200 to 1400° C. in vacuum or nitrogen atmosphere. At this time, a temperature of the mixture is raised in a non-oxidative atmosphere such as vacuum, nitrogen atmosphere, inert gas atmosphere, hydrogen atmosphere, etc. to prevent oxidation of the mixture. When a mixture is heated in a non-oxidative atmosphere to a liquid phase-appearing temperature of 1200 to 1400° C. or higher, a liquid phase in which W or Mo, etc. is/are dissolved in iron group metal(s) such as Co and Ni, etc. occurs. As temperature is further raised, other metal element(s) is/are also dissolved so that a liquid phase amount is increased. A temperature of the mixture is raised from the first heating temperature of 1200 to 1400° C. to the second heating temperature of 1480 to 1600° C. in a mixed gas atmosphere of nitrogen and argon at a pressure of 1 Torr or more so that a nitrogen partial pressure in the atmosphere becomes 0.25 Torr or more, and in the similar atmosphere, the mixture is maintained at the second heating temperature for a predetermined time to carry out sintering. In this course of procedure, fine particles are dissolved in the liquid phase and precipitated on the coarse particles to proceed with formation of a stable structure in energy. At the time of forming coarse particles by dissolving fine particles, W dissolved in the liquid phase does not easily form a nitride, so that W once dissolved is not easily precipitated on the grains of the carbonitride. Thus, accompanying with progress of densification and stabilization of the structure at the second heating temperature, a W amount in the liquid phase is increased. At this time, by carrying out the sintering by raising the temperature in a mixed gas atmosphere of nitrogen and argon at a pressure of 1 Torr or more, in the course of dissolving fine particles and precipitating on the coarse grains, denitrification can be restrained so that modification of the cermet structure can be prevented and also the W amount in the liquid phase can be heightened. Incidentally, a pressure of the mixed gas atmosphere of nitrogen and argon is preferably 1 Torr or more, but if it exceeds 100 Torr, the surface layer structure of the cermet can be difficult to control so that a pressure of the mixed gas atmosphere comprising nitrogen and argon is preferably 1 to 100 Torr. Also, a nitrogen partial pressure thereof is preferably 25 to 75% based on the whole pressure. If it is less than 25%, denitrification cannot be prevented, while if it exceeds 75%, control of the structure at the cermet surface is difficult. In the course of cooling from the second heating temperature to the normal temperature, the solubility of the solute in the liquid phase decreases accompanying with cooling. W dissolved in the liquid phase is difficult to precipitate on the hard phase of the carbonitride, and rather easily precipitated between grains of the hard phase of the carbonitride, or at the grain boundary triple points. Thus, the interfacial phase containing much amount of W is formed between portion of the hard phase or at the grain boundary triple points. An atmosphere in the course of the cooling procedure from the second heating temperature to the normal temperature is preferably a non-oxidative atmosphere to prevent oxidation, and among these, vacuum, an inert gas atmosphere, and a mixed gas atmosphere of nitrogen and argon are preferred. According to the above-mentioned procedures, the cermet of the present invention in which the interfacial phase containing a large amount of W is formed between grains of the hard phase can be obtained.

Moreover, by covering the above-mentioned hard film onto the surface of the cermet of the present invention by a PVD method or a CVD method, a coated cermet of the present invention can be obtained.

EXAMPLES

As starting powders of a complex carbonitride solid solution, TiC powder having an average particle size of 1.5 μm, Ti($C_{0.3}N_{0.7}$) powder having an average particle size of 1.5 μm, WC powder having an average particle size of 2.0 μm, NbC powder having an average particle size of 2.3 μm, $Mo_2C$ powder having an average particle size of 1.8 μm were prepared. The starting powders were formulated so that the final compositions became ($Ti_{0.8}Nb_{0.1}W_{0.1}$)($C_{0.5}N_{0.5}$), ($Ti_{0.85}Nb_{0.1}W_{0.05}$)($C_{0.5}N_{0.5}$), and ($Ti_{0.8}Nb_{0.1}Mo_{0.1}$)($C_{0.5}N_{0.5}$). The formulated starting powders were each mixed by a ball mill, and the resulting mixed powders were subjected to heat treatment at a pressure of 1 atm in a nitrogen atmosphere at 2200° C. for 2 hours. After cooling, each of the resulting bulky material of the complex carbonitride was pulverized to obtain ($Ti_{0.8}Nb_{0.1}W_{0.1}$)($C_{0.5}N_{0.5}$) powder having an average particle size of 1.5 μm, ($Ti_{0.85}Nb_{0.1}W_{0.05}$)($C_{0.5}N_{0.5}$) powder having an average particle size of 2.5 μm, and ($Ti_{0.8}Nb_{0.1}Mo_{0.1}$)($C_{0.5}N_{0.5}$) powder having an average particle size of 2.6 μm.

As starting powders of a cermet, Ti ($C_{0.5}N_{0.5}$) powder having an average particle size of 1.5 μm, ZrC powder having an average particle size of 1.9 μm, TaC powder having an average particle size of 1.8 μm, NbC powder having an average particle size of 2.3 μm, WC powder having an average particle size of 2.0 μm, $Mo_2C$ powder having an average particle size of 1.8 μm, Co powder having an average particle size of 1.4 μm, and Ni powder having an average particle size of 1.6 μm were prepared. By using these powders and the ($Ti_{0.8}Nb_{0.1}W_{0.1}$)($C_{0.5}N_{0.5}$) powder having an average particle size of 1.5 μm, ($Ti_{0.85}Nb_{0.1}W_{0.05}$)($C_{0.5}N_{0.5}$) powder having an average particle size of 2.5 μm, and ($Ti_{0.8}Nb_{0.1}Mo_{0.1}$)($C_{0.5}N_{0.5}$) powder having an average particle size of 2.6 μm, they were weighed with the formulation compositions shown in Table 1. From the formulation compositions, a W amount (% by weight) contained in the whole starting powders of the cermet was obtained, and the value was also shown in Table 1.

TABLE 1

| Sample No. | Formulation composition (% by weight) | W amount contained in the whole starting powders (% by weight) |
|---|---|---|
| Present product 1 | 58.5% Ti($C_{0.5}N_{0.5}$)—28.0% WC—1.0% $Mo_2C$—7.5% Co—5.0% Ni | 26 |
| Present product 2 | 87.0% ($Ti_{0.8}Nb_{0.1}W_{0.1}$)($C_{0.5}N_{0.5}$)—13.0% Co | 20 |
| Present product 3 | 86.3% ($Ti_{0.85}Nb_{0.1}W_{0.05}$)($C_{0.5}N_{0.5}$)—13.7% Ni | 10 |
| Present product 4 | 53.5% Ti($C_{0.5}N_{0.5}$)—12.0% NbC—21.0% WC—0.5% ZrC—6.5% Co—6.5% Ni | 20 |

TABLE 1-continued

| Sample No. | Formulation composition (% by weight) | W amount contained in the whole starting powders (% by weight) |
|---|---|---|
| Present product 5 | 61.0% Ti($C_{0.5}N_{0.5}$)—10.0% NbC—15.0% WC—7.0% Co—7.0% Ni | 14 |
| Comparative product 1 | 75.0% TiC—10.0% WC—15.0% Ni | 9 |
| Comparative product 2 | 57.0% Ti($C_{0.5}N_{0.5}$)—20.0% TaC—10.0% $Mo_2C$—8.0% Co—5.0% Ni | — |
| Comparative product 3 | 85.5% ($Ti_{0.8}Nb_{0.1}Mo_{0.1}$)($C_{0.5}N_{0.5}$)—14.5% Co | — |
| Comparative product 4 | 42.0% Ti($C_{0.5}N_{0.5}$)—47.0% WC—6.0% Co—5.0% Ni | 44 |

The weighed mixed powder was mixed and pulverized by a wet ball mill, and then, the solvent was evaporated to dry the mixture. To the dried mixture was added paraffin, and the mixture was subjected to press molding. Here, with regard to the present products 1 to 5, the press molded mixture was placed in a sintering furnace, and after evaporating the paraffin by gradually raising the temperature to 450° C. in vacuum, a temperature was further raised to the first heating temperature of 1220° C. in vacuum. Further, a temperature of the mixture was raised from the first heating temperature of 1220° C. to the second heating temperature of 1550° C. in a mixed gas atmosphere of argon and nitrogen at a pressure of 1 Torr with a nitrogen partial pressure of 0.5 Torr, and maintained at the second heating temperature of 1550° C. in a mixed gas atmosphere of argon and nitrogen a pressure of 1 Torr with a nitrogen partial pressure of 0.5 Torr for 50 minutes to carry out sintering. After sintering, it was cooled in a mixed gas atmosphere of argon and nitrogen to the normal temperature to obtain cermets of the present products 1 to 5. On the other hand, with regard to the comparative products 1 to 4, each press molded mixture was placed in a sintering furnace, and after evaporating the paraffin by gradually raising the temperature to 450° C. in vacuum, a temperature was further raised to the first heating temperature of 1280° C. in vacuum. Further, a temperature of the mixture was raised from 1280° C. to 1550° C. in vacuum, and maintained at 1550° C. in vacuum for 50 minutes to carry out sintering. Further, a temperature of the mixture was raised from 1280° C. to 1550° C. in vacuum, and sintered by maintaining the mixture in vacuum at 1550° C. for 50 minutes. After sintering, the atmosphere was changed to an argon atmosphere, and the product was cooled from the sintering temperature of 1550° C. to a normal temperature to obtain cermets of Comparative products 1 to 4.

With regard to the obtained samples, a constitution of the structure and a composition constituting the alloy were examined by a scanning type electron microscope, EDS attached to the scanning type electron microscope, a transmission type electron microscope, and EDS attached to the transmission type electron microscope. These results were shown in Table 2. Incidentally, in either of the samples, a sum of Ni and Co contained in the binder phase was 50% by weight or more based on the whole metal element contained in the binder phase. Also, a sum of W, Ti and Mo contained in the binder phase was less than 40% by weight based on the whole metal elements contained in the binder phase, and dissolved in Ni and/or Co.

TABLE 2

Main constitution of alloy structure

| Sample No. | Main hard phase | Binder phase (% by weight) |
|---|---|---|
| Present product 1 | [Core-rim structure carbonitride comprising Ti(C, N) core portion and (Ti, W, Mo)(C, N) rim portion], Ti(C, N) | Ni: 46%, Co: 30%, W: 22%, Mo: 1%, Ti: 1% |
| Present product 2 | [Core-rim structure carbonitride comprising (Ti, Nb, W)(C, N) core portion and (Ti, Nb, W)(C, N) rim portion] | Co: 68%, W: 31%, Ti: 1% |
| Present product 3 | [Core-rim structure carbonitride comprising (Ti, Nb, W)(C, N) core portion and (Ti, Nb, W)(C, N) rim portion] | Ni: 73%, W: 25%, Ti: 2% |
| Present product 4 | [Core-rim structure carbonitride comprising Ti(C, N) core portion and (Ti, Nb, W, Zr)(C, N) rim portion], Ti(C, N) | Co: 39%, Ni: 40%, W: 19%, Ti: 2% |
| Present product 5 | [Core-rim structure carbonitride comprising Ti(C, N) core portion and (Ti, Nb, W)(C, N) rim portion], Ti(C, N) | Co: 41%, Ni: 41%, W: 17%, Ti: 1% |
| Comparative product 1 | [Core-rim structure carbonitride comprising TiC core portion and (Ti, W)C rim portion] | Ni: 88%, Ti: 10%, W: 2% |
| Comparative product 2 | [Core-rim structure carbonitride comprising Ti(C, N) core portion and (Ti, Ta, Mo)(C, N) rim portion] | Co: 52%, Ni: 33%, Mo: 7%, Ti: 8% |
| Comparative product 3 | (Ti, Nb, Mo)(C, N) | Co: 81%, Mo: 18%, Ti: 1% |
| Comparative product 4 | [Core-rim structure carbonitride comprising Ti(C, N) core portion and (Ti, W)(C, N) rim portion], Ti(C, N), WC | Co: 47%, Ni: 40%, W: 12%, Ti: 1% |

By cutting the center portion of the each test sample, a sample for observing with a transmission type electron microscope was prepared, and the predetermined position on the cermet structure was analyzed by EDS attached to the transmission type electron microscope. In Present products 1 to 5, the interfacial phase was formed between grains of the hard phase. In Comparative products 1 to 4, no interfacial phase was formed. A W amount contained in the interfacial phase existing between grains of the hard phase based on the whole metal element: Wb (atomic %) was measured. To examine a W amount contained in the hard phase based on the whole metal element: Wh (atomic %), a W amount at the portion 200 nm inside of the interface between the hard phase and the interfacial phase was measured, and the value was designated Wh (atomic %). From these values, an atomic ratio of Wb to Wh: Wb/Wh was obtained. Also, a W amount: We (atomic %) based on the whole metal element contained in the core portion of the hard phase was measured. A W amount: Wr (atomic %) based on the whole metal element contained in the peripheral portion of the hard phase was measured. From these values, an atomic ratio of We to Wr: Wc/Wr was obtained. These results are shown in Table 3. Incidentally, there exists the interfacial phase adjacent to the hard phase comprising Ti(C,N) grains which take no core-rim structure, but a W amount: Wh (atomic %) contained in the hard phase comprising Ti(C,N) grains is zero, so that Wb/Wh becomes infinite. Therefore, in Table 3, Wb/Wh (atomic ratio) obtained from a W amount: Wh (atomic %) contained in the hard phase having a core-rim structure containing W or contained in the hard phase comprising a complex carbonitride solid solution containing W, and a W amount: Wb (atomic %) contained in the interfacial phase adjacent thereto was described. Also, in Table 3, Wc/Wr=0 (atomic ratio) means that it is the hard phase having a core-rim structure which has the core portion (for example, the core portion comprising Ti(C,N) or TiC, etc.) containing no W.

TABLE 3

| Sample No. | Wb/Wh (Atomic ratio) | Wc/Wr (Atomic ratio) |
| --- | --- | --- |
| Present product 1 | 2.3 | 0 |
| Present product 2 | 2.7 | 1.2 |
| Present product 3 | 2.5 | 1.1 |
| Present product 4 | 2.1 | 0 |
| Present product 5 | 1.9 | 0 |
| Comparative product 1 | — | 0 |
| Comparative product 2 | — | 0 |
| Comparative product 3 | — | — |
| Comparative product 4 | — | 0 |

Grinding and honing were applied to the obtained samples, an insert with the predetermined shape was prepared, and Cutting Tests with cutting conditions 1 and 2 were carried out by using the same.

[Cutting Test 1]
Fracture resistance evaluation test
Sample shape: ISO Standard TNGN160408
Work piece material: S48C (shape: substantially cylindrical shape wherein four grooves were provided to the cylinder)
Cutting speed: 160 m/min
Cutting depth: 2.0 mm
Feed: 0.2 mm/rev
Atmosphere: Wet cutting
Tested times: 3 times Judgment criteria of lifetime: A number of impact times until fracture occurs is made a lifetime. Incidentally, if the sample is not fractured until the number of impact times became 30000 times, the test is terminated at that time.

TABLE 4

| Sample No. | $1^{st}$ time | $2^{nd}$ time | $3^{rd}$ time |
| --- | --- | --- | --- |
| Present product 1 | 21023 | 18301 | 19925 |
| Present product 2 | 25000 or more | 25000 or more | 25000 or more |
| Present product 3 | 25000 or more | 25000 or more | 21985 |
| Present product 4 | 19001 | 21994 | 17340 |
| Present product 5 | 15491 | 10005 | 19211 |
| Comparative product 1 | 3214 | 4742 | 3042 |
| Comparative product 2 | 5149 | 5967 | 4342 |
| Comparative product 3 | 7469 | 6712 | 7165 |
| Comparative product 4 | 12102 | 13166 | 8492 |

As shown in Table 4, it can be understood that Present products are excellent in fracture resistance and have longer life times than those of Comparative products.

[Cutting Test 2]
Wear resistance evaluation test
Sample shape: ISO Standard SPGN120408
Work piece material: SCM440 (shape: block state)
Milling cutter: A milling cutter in which an insert is attached to the milling cutter having an effective cutter diameter of 160 mm for the purpose of carrying out the test.
Cutting speed: 150 m/min
Cutting depth: 2.0 mm
Feed: 0.22 mm/tooth (F=64 mm/min)
Atmosphere: Dry cutting Judgment criteria of lifetime: When the sample is fractured, or, a time when the maximum flank wear $V_{Bmax}$ became 0.3 mm or more, it is made a lifetime.

TABLE 5

| Sample No. | Judgment criteria of lifetime | Processed length |
| --- | --- | --- |
| Present product 1 | Wear | 4.0 m |
| Present product 2 | Wear | 4.9 m |
| Present product 3 | Wear | 4.7 m |
| Present product 4 | Wear | 4.2 m |
| Present product 5 | Fracture | 3.8 m |
| Comparative product 1 | Fracture | 1.1 m |
| Comparative product 2 | Fracture | 1.9 m |
| Comparative product 3 | Wear | 2.8 m |
| Comparative product 4 | Wear | 2.4 m |

As shown in Table 5, it can be understood that the present products are longer in the processed length and have longer lifetime than those of the comparative products. When WC is too much as in Comparative product 4, thermal conductivity is high, and no thermal crack occurs. However, Comparative product 4 is easily reacted with a work piece material and inferior in wear resistance so that it has a short lifetime.

Grinding and honing were applied to the cermet of Present product 2 to prepare a cutting insert having a shape of ISO Standard TNGN160408, and a hard film shown in Table 6 was each coated on the surface to prepare Present products 6 and 7.

TABLE 6

| Sample No. | Coating method | Layer constitution (Film thickness (μm)) | | | | Total film thickness |
|---|---|---|---|---|---|---|
| | | First layer | Second layer | Third layer | Fourth layer | |
| Present product 6 | PVD | TiAlN (2.5) | — | — | — | 2.5 μm |
| Present product 7 | CVD | TiN (1.0) | TiCN (7.0) | Al$_2$O$_3$ (1.5) | TiN (0.5) | 10.0 μm |

Cutting Test 3 was carried out by using the obtained Present products 6 and 7, and Present product 2 having a shape of ISO Standard TNGN160408.

[Cutting Test 3 (Wear Resistance Test)]
Wear resistance evaluation test
Work piece material: S53C (shape: cylindrical shape)
Cutting speed: 140 m/min
Cutting depth: 2.0 mm
Feed: 0.25 mm/rev
Atmosphere: Dry cutting Judgment standard of lifetime: When the sample is fractured, or, a time when the maximum flank wear $V_{Bmax}$ became 0.3 mm or more, it is made a lifetime.

TABLE 7

| Sample No. | Judgment standard of lifetime | Processing time |
|---|---|---|
| Present product 2 | Wear | 3 minutes 10 seconds |
| Present product 6 | Wear | 6 minutes 25 seconds |
| Present product 7 | Wear | 15 minutes 10 seconds |

The coated cermets of Present products 6 and 7 in which the hard film is coated on the cermet of Present product 2 are excellent in wear resistance, so that the processing time is longer than that of the cermet of Present product 2.

According to the present invention, a cermet and a coated cermet which are good in fracture resistance and wear resistance are provided.

What is claimed is:

1. A cermet which comprises:
a hard phase which contains W and nitrogen, and comprises at least one selected from a carbide, nitride and carbonitride of a metal comprising Ti as a main component,
a binder phase comprising an iron group metal as a main component, the binder phase is a material in which one or more elements of Group 4, 5 or 6 of the Periodic Table is dissolved in an iron group metal in a total amount of 18% or more by weight and 32% or less by weight, and
an interfacial phase comprising a complex carbonitride with a larger W amount than a W amount of the hard phase, the interfacial phase being present between grains of the hard phase,
wherein a W amount contained in the whole cermet is 5 to 40% by weight, and
when a W amount contained in the interfacial phase based on the whole metal element is represented by Wb (atomic %), and a W amount contained in the hard phase based on the whole metal element is represented by Wh (atomic %), an atomic ratio of Wb to Wh (Wb/Wh) is 1.7 or more.

2. The cermet according to claim 1, wherein:
a W amount contained in the core portion of the hard phase based on the whole metal element is represented by Wc (atomic %),
a W amount contained in the peripheral portion of the hard phase based on the whole metal element is represented by Wr (atomic %), and
an atomic ratio of Wc to Wr (Wc/Wr) is 0.5 or more and 1.4 or less.

3. The cermet according to claim 1, wherein a W amount contained in the whole cermet is 10 to 26% by weight.

4. The cermet according to claim 1, wherein:
the interfacial phase is a layered complex carbonitride formed between grains of the hard phase and having an average thickness of 10 to 500 nm.

5. The cermet according to claim 1, wherein:
the interfacial phase is carbonitride containing Ti and W and having a crystal structure of NaCl structure.

6. The cermet according to claim 1, wherein:
the binder phase comprises one or two of Co and Ni as a main component(s), and an element of Group 4, 5 or 6 of the Periodic Table is dissolved therein in an amount of 2% by weight or more and less than 30% by weight.

7. The cermet according to claim 6, wherein:
the binder phase comprises Co as a main component, and an element of Group 4, 5 or 6 of the Periodic Table is dissolved therein in an amount of 2% by weight or more and less than 30% by weight.

8. The cermet according to claim 1, wherein:
when a W amount contained in the interfacial phase based on the whole metal element is represented by Wb (atomic %), and a W amount contained in the hard phase based on the whole metal element is represented by Wh (atomic %), an atomic ratio of Wb to Wh (Wb/Wh) is 1.7 or more and 2.8 or less.

9. A coated cermet in which a hard film is coated on the surface of a cermet, wherein the cermet comprises:
a hard phase which contains W and nitrogen, and comprises at least one selected from a carbide, nitride and carbonitride of a metal comprising Ti as a main component,
a binder phase comprising an iron group metal as a main component, the binder phase is a material in which one or more elements of Group 4, 5 or 6 of the Periodic Table is dissolved in an iron group metal in a total amount of 18% or more by weight and 32% or less by weight, and
an interfacial phase comprising a complex carbonitride with a larger W amount than a W amount of the hard phase, the interfacial phase being present between grains of the hard phase,
wherein a W amount contained in the whole cermet is 5 to 40% by weight, and
when a W amount contained in the interfacial phase based on the whole metal element is represented by Wb (atomic %), and a W amount contained in the hard phase based on the whole metal element is represented by Wh (atomic %), an atomic ratio of Wb to Wh (Wb/Wh) is 1.7 or more.

10. The coated cermet according to claim 9, wherein:
the hard film comprises at least one selected from the group consisting of an oxide, carbide or nitride of an element of Group 4, 5 or 6 of the Periodic Table, Al and Si, and a mutual solid solution thereof, and carbon.

11. The coated cermet according to claim 9, wherein:
the hard film comprises at least one selected from the group consisting of TiN, TiC, TiCN, TiAlN, TiSiN, AlCrN, Al$_2$O$_3$ and diamond and diamond-like carbon.

12. The coated cermet according to claim 9, wherein:
a W amount contained in the core portion of the hard phase based on the whole metal element is represented by Wc (atomic %), a W amount contained in the peripheral portion of the hard phase based on the whole metal element is represented by Wr (atomic %), and an atomic ratio of Wc to Wr (Wc/Wr) is 0.5 or more and 1.4 or less.

13. The coated cermet according to claim 9, wherein:

a W amount contained in the whole cermet is 10 to 26% by weight.

14. The coated cermet according to claim 9, wherein:

the interfacial phase is a layered complex carbonitride formed between grains of the hard phase and having an average thickness of 10 to 500 nm.

15. The coated cermet according to claim 9, wherein:

the interfacial phase is carbonitride containing Ti and W and having a crystal structure of NaCl structure.

16. The coated cermet according to claim 9, wherein:

the binder phase comprises one or two of Co and Ni as a main component(s), and an element of Group 4, 5 or 6 of the Periodic Table is dissolved therein in an amount of 2% by weight or more and less than 30% by weight.

17. The coated cermet according to claim 9, wherein:

the binder phase comprises Co as a main component, and an element of Group 4, 5 or 6 of the Periodic Table is dissolved therein in an amount of 2% by weight or more and less than 30% by weight.

18. The coated cermet according to claim 9, wherein:

when a W amount contained in the interfacial phase based on the whole metal element is represented by Wb (atomic %), and a W amount contained in the hard phase based on the whole metal element is represented by Wh (atomic %), an atomic ratio of Wb to Wh (Wb/Wh) is 1.7 or more and 2.8 or less.

19. A cermet which comprises:

a hard phase which contains W and nitrogen, and comprises at least one selected from a carbide, nitride and carbonitride of a metal comprising Ti as a main component, a binder phase comprising an iron group metal as a main component, the binder phase is a material in which one or more elements of Group 4, 5 or 6 of the Periodic Table is dissolved in an iron group metal in a total amount of 18% or more by weight and 32% or less by weight, and an interfacial phase comprising a complex carbonitride with a larger W amount than a W amount of the hard phase, the interfacial phase being present between particles of the hard phase.

20. The cermet according to claim 19, wherein:

a W amount contained in the whole cermet is 10 to 26% by weight;

the binder phase comprises Co as a main component;

the interfacial phase is a layered complex carbonitride formed between grains of the hard phase and having an average thickness of 10 to 500 nm;

when a W amount contained in a core portion of the hard phase based on the whole metal element is represented by Wc (atomic %), and a W amount contained in a peripheral portion of the hard phase based on the whole metal element is represented by Wr (atomic %), an atomic ratio of Wc to Wr (Wc/Wr) is 0.5 or more and 1.4 or less; and when a W amount contained in the interfacial phase based on the whole metal element is represented by Wb (atomic %), and a W amount contained in the hard phase based on the whole metal element is represented by Wh (atomic %), an atomic ratio of Wb to Wh (Wb/Wh) is 1.7 or more and 2.8 or less.

\* \* \* \* \*